United States Patent [19]
McNulty

[11] Patent Number: 6,130,530
[45] Date of Patent: Oct. 10, 2000

[54] TESTER FOR POWER TRANSFORMERS AND CAPACITORS

[75] Inventor: William J. McNulty, River Forest, Ill.

[73] Assignee: HD Electric Company, Waukegan, Ill.

[21] Appl. No.: 08/996,161

[22] Filed: Dec. 22, 1997

[51] Int. Cl.$^7$ .................................................. G01R 31/02

[52] U.S. Cl. ...................... 324/73.1; 324/764; 324/546; 324/548

[58] Field of Search .................................. 324/73.1, 764, 324/548, 546, 547, 519, 537

[56] References Cited

U.S. PATENT DOCUMENTS

| | | |
|---|---|---|
| 3,932,806 | 1/1976 | Kawada . |
| 4,031,465 | 6/1977 | Sterner . |
| 4,160,206 | 7/1979 | Bojarski . |
| 4,573,007 | 2/1986 | Mefford . |
| 4,580,091 | 4/1986 | Robinson et al. . |
| 4,634,971 | 1/1987 | Johnson et al. . |
| 4,675,597 | 6/1987 | Hernandez . |
| 4,714,875 | 12/1987 | Bailey ...................................... 324/73.1 |
| 4,791,376 | 12/1988 | Freedman et al. . |
| 4,859,932 | 8/1989 | Whitley . |
| 4,897,794 | 1/1990 | Tsurumi . |
| 4,924,177 | 5/1990 | Mulz . |
| 5,055,828 | 10/1991 | Königstein et al. . |
| 5,193,108 | 3/1993 | Stocklin . |
| 5,202,640 | 4/1993 | Schaaf ...................................... 324/537 |
| 5,294,889 | 3/1994 | Heep et al. . |
| 5,477,133 | 12/1995 | Earle . |
| 5,477,152 | 12/1995 | Hayhurst . |
| 5,502,375 | 3/1996 | Marek . |
| 5,528,137 | 6/1996 | Riggio, Jr. . |
| 5,572,143 | 11/1996 | Myers et al. . |
| 5,574,769 | 11/1996 | Clement . |

OTHER PUBLICATIONS

Brochure for "TILT" transformer tester of HD Electric Company, Jan. 1996.

*Primary Examiner*—Josie Ballato
*Assistant Examiner*—Jose M. Solis
*Attorney, Agent, or Firm*—Seyfarth, Shaw, Fairweather & Geraldson

[57] ABSTRACT

A tester for power transformers and capacitors includes a pulse generator for applying a pulsating test signal to a pair of test leads which may be connected across the terminals of the device to be tested. Also connected across the test leads are a capacitor detector, an inductor detector and a continuity detector. If the connections to the transformer or capacitor in the device to be tested are good, the capacitor detector and inductor detector will distinguish one from the other and indicate that its condition is good. If the connections to the device are not good, the continuity detector will indicate whether there is a short circuit or open circuit condition. The detectors are coupled through control logic circuitry to an indicator circuit including a horn and blinking lights for providing unique indications of capacitor okay, inductor okay, short and open conditions. The capacitor detector provides a discharge path for a capacitor and detects the discharge current flow. The inductor detector responds to the kickback voltage of an inductor, which is of a polarity opposite to that of the input test pulse. The continuity detector measures voltage level to distinguish between impedance levels respectively corresponding to substantially open and substantially short circuit conditions.

23 Claims, 3 Drawing Sheets

TESTER FOR POWER TRANSFORMERS AND CAPACITORS

BACKGROUND OF THE INVENTION

1. Field of the Invention

The present invention relates to field test equipment for use in testing electric power distribution circuits and equipment. The invention has particular application to the testing of power transformers and capacitors.

2. Description of the Prior Art

The present invention is an improvement of a prior art transformer and connection tester sold by HD Electric Company under the trade name "TILT". The TILT tester can be used for checking connected transformer primary or secondary leads for shorts or opens. Unlike a standard ohmmeter, the TILT tester differentiates between the inductance of a transformer winding, a short, or an open. If an inductance is sensed between the test leads of the tester, the tester sounds a horn and flashes an LED indicating that the transformer is okay. Shorts or opens within the transformer are indicated by other LEDs. However, the device is usable only for testing transformer windings or other inductors and their connected leads.

It is known to provide other types of testers for testing capacitors. However, such prior devices simply measure the capacitance value of the capacitor or test the orientation of a polarized capacitor. However, such devices will not identify a capacitor, as such, i.e., distinguish it from other circuit elements and, specifically, cannot automatically distinguish between capacitors and inductors. Rather, the user must know the nature of the device being tested beforehand.

SUMMARY OF THE INVENTION

It is a general object of the invention to provide an improved test apparatus which avoids the disadvantages of prior testers while affording additional structural and operating advantages.

An important feature of the invention is the provision of a test apparatus which is capable of identifying a tested device as a capacitor, as well as testing the condition of the connections to the capacitor.

In connection with the foregoing feature, a further feature of the invention is the provision of a test apparatus of the type set forth, which can identify and distinguish between capacitors and transformers or other inductors.

Still another feature of the invention is the provision of a test apparatus of the type set forth, which can identify and signal the condition of reactive tested devices, including whether the device is properly connected and whether its connections are shorted or open.

Certain ones of these and other features of the invention may be attained by providing test apparatus for identifying characteristics of a tested device comprising: a signal generator having test leads across which the tested device may be connected for applying a test signal to the tested device, and a detection circuit connected across the test leads for sensing the response of the tested device to the test signal, the detection circuit including a capacitor detector having a discharge path and a switch operable in response to discharge of a capacitor through the discharge path.

Other features of the invention may be attained by providing test apparatus for identifying characteristics of a tested device comprising: a signal generator having test leads across which the tested device may be connected for applying a test signal to the tested device, and a detection circuit connected across the test leads for sensing the response of the tested device to the test signal, the detection circuit including a capacitor detector providing a first indication if the tested device is capacitive, an inductor detector providing a second indication if the tested device is inductive, and a circuit continuity detector providing a further indication if the tested device is open-circuited or short-circuited.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1:
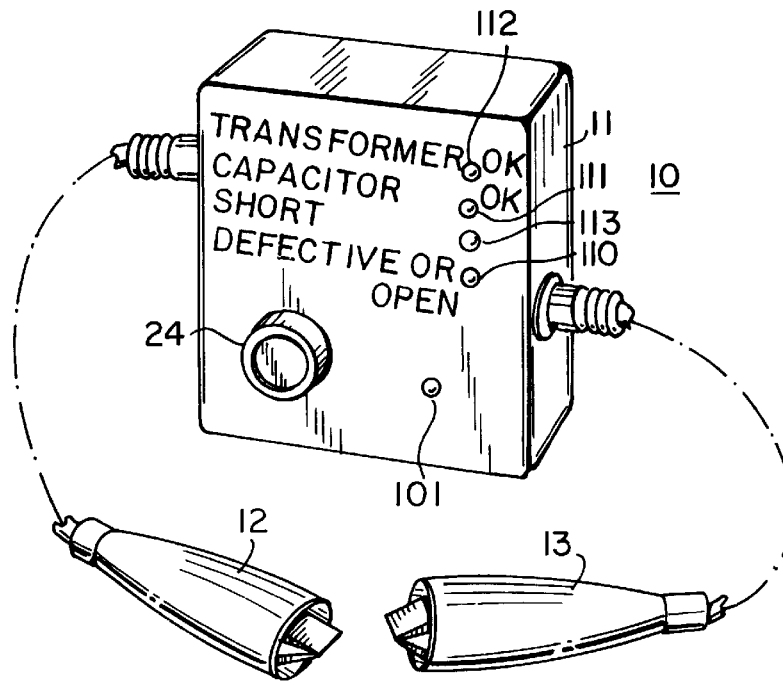
FIG. 1 is a perspective view of the test apparatus of the present invention.
Figure 2:
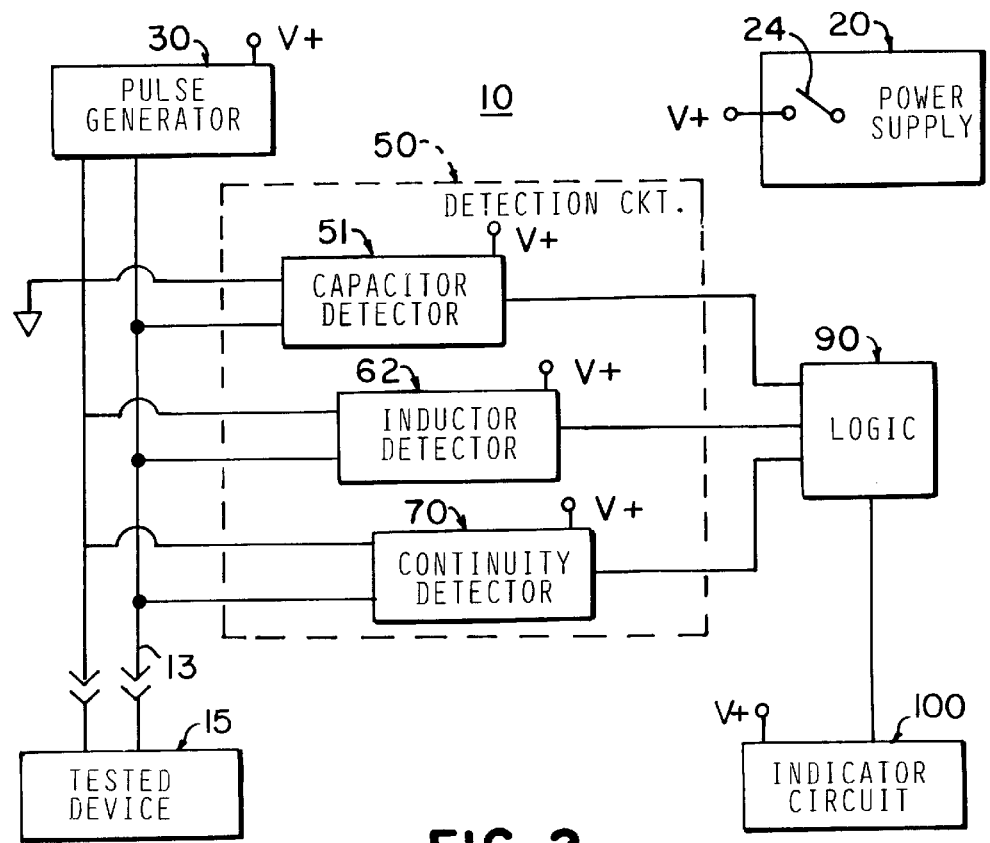
FIG. 2 is a functional block diagrammatic view of the circuitry of the test apparatus of FIG. 1 and an associated device to be tested with which it may be used.

Referring to FIGS. 1 and 2, there is illustrated a test apparatus, generally designated by the numeral 10, constructed in accordance with the present invention. The test apparatus 10 may be provided with a housing 11 having a pair of test leads 12 and 13 projecting therefrom and provided with suitable terminals, such as alligator clips or the like. The test lead 12 is connected to circuit common, which may be an earth ground, and the leads 12, 13 are adapted to be connected across the terminals of an associated tested device 15, such as a capacitor or a transformer or other inductor to be tested.

The test apparatus 10 is preferably battery-powered and has a power supply 20 including a push-button power switch 24 for outputting a suitable DC supply voltage V+ to selected portions of the remainder of the circuitry. The test apparatus 10 also includes a pulse generator 30 which outputs a pulsating test signal to the test leads 12, 13, to be applied to the tested device 15. The test apparatus 10 further includes a detection circuit 50 for sensing the response of the tested device 15 to the test signal. More particularly, the detection circuit 50 includes a capacitor detector 51, an inductor detector 62 and a continuity detector 70, each of which has a pair of input terminals connected across the test leads 12, 13 and an output coupled to a control logic circuit 90 which is, in turn, connected to an indicator circuit 100. The indicator circuit 100 preferably includes an audible indicator, such as a horn or buzzer 101, and a plurality of visual indicators, such as LEDs 110, 111, 112 and 113 visible at the front panel of the housing 11.

Figure 3:
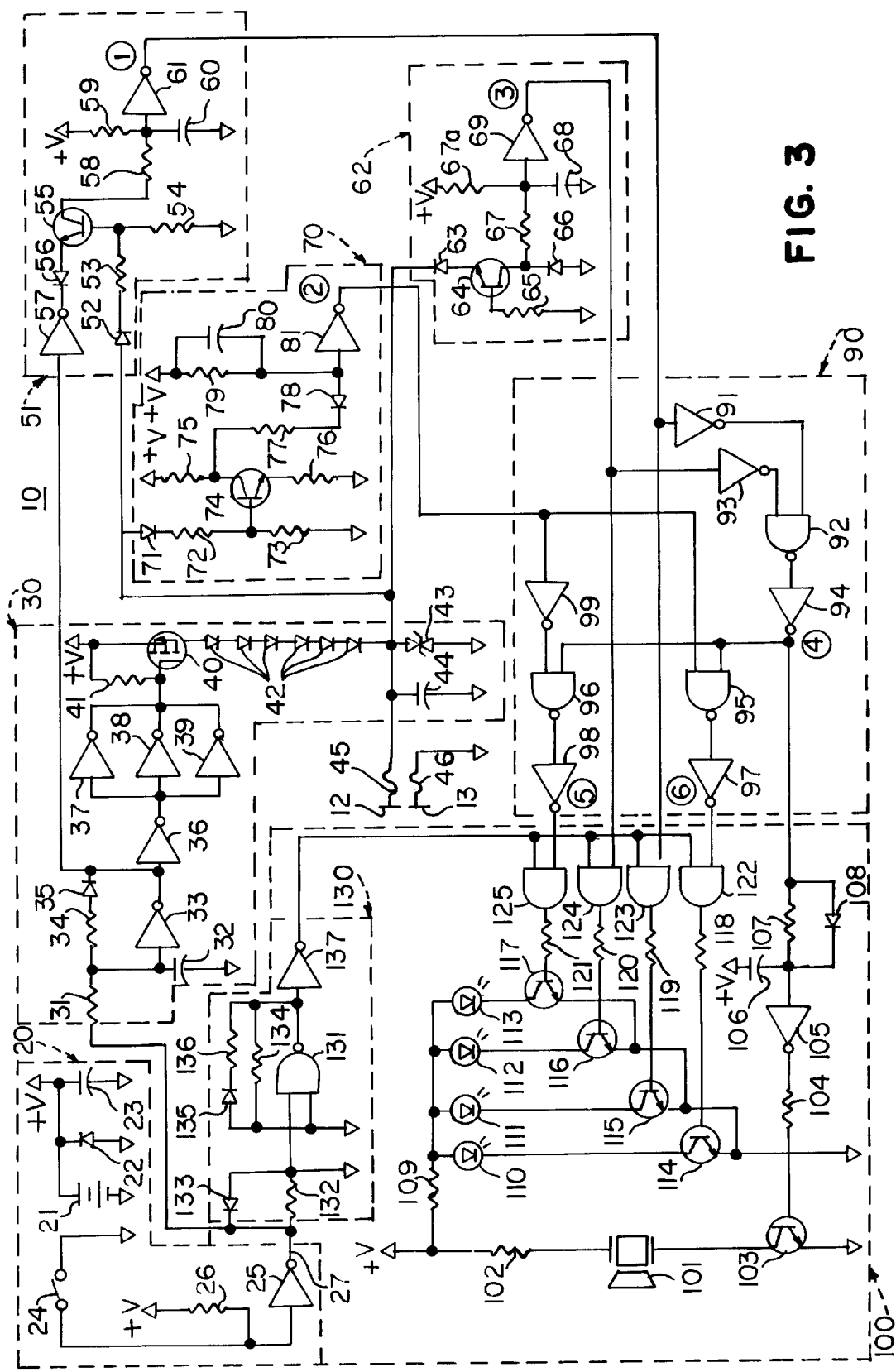
FIG. 3 is a schematic diagram of the circuitry of the test apparatus of FIG. 1.

Referring now also to the schematic circuit diagram of FIG. 3, the power supply 20 includes a battery 21, such as a nine-volt battery, across which are connected to protect against reversal of the battery, a diode 22 and a filter capacitor 23. Also connected across the battery 21 are the series combination of a resistor 26 and the power switch 24, which is a normally-open push-button switch. The power supply 20 has a supply terminal for providing a V+ DC supply voltage to the remainder of the circuitry. The junction between the switch 24 and the resistor 26 is connected through an inverter 25 to a supply line 27.

The supply line 27 is connected to the pulse generator 30 and, more particularly, through a resistor 31 to the input of an inverter 33, which input is also connected to common through a capacitor 32. The input of the inverter 33 is also connected through a resistor 34 and a diode 35 to the input of an inverter 36, which input is also connected directly to the output of the inverter 33. The output of the inverter 36 is connected to the inputs of parallel inverters 37, 38 and 39, the outputs of which are all connected to the gate of a MOSFET 40. The V+ supply is connected to the source of the MOSFET 40 and, through a resistor 41, to its gate. The drain of the transistor 40 is connected to common through six series-connected diodes 42 and a transient voltage suppressor ("TVS") 43, a capacitor 44 being connected in parallel with the TVS 43. The capacitor 44 is connected to the test lead 12 through a fuse 45, while the test lead 13 is connected to common through a fuse 46.

The test lead 12 is also connected to the capacitor detector 51 and, more particularly, to the anode of a diode 52, the cathode of which is connected through a resistor 53 to the base of a transistor 55, which base is also connected to common through a resistor 54. The collector of the transistor 55 is connected through a resistor 58 to the input of an inverter 61, which input is also connected to the V+ supply through a resistor 59, and to common through a capacitor 60. The emitter of the transistor 55 is connected to the anode of a diode 56, the cathode of which is connected to the output of an inverter 57 which has its input connected to the cathode of the diode 35 in the pulse generator 30. The output of the capacitor detector 51 is taken at the output of the inverter 61, designated by "①".

The test lead 12 is also connected to the transformer detector 62 and, more specifically, to the cathode of a diode 63, the anode of which is connected to the emitter of a transistor 64 which has its base connected to common through a resistor 65 and its collector connected to the cathode of a diode 66, the anode of which is connected to common. The collector of the transistor 64 is also connected through a resistor 67 to the input of an inverter 69, which input is also connected to the V+ supply through a resistor 67a and to common through a capacitor 68. The output of the transformer detector 62 is taken at the output of the inverter 69, designated by "③".

The test lead 12 is also connected to the continuity detector 70 and, more particularly, to the anode of a diode 71, the cathode of which is connected through a resistor 72 to the base of a transistor 74, which base is also connected to common through a resistor 73. The collector of the transistor 74 is connected to the V+ supply through a resistor 75, and its emitter is connected through a resistor 76 to common. The collector of the transistor 74 is also connected through a resistor 77 to the cathode of a diode 78, the anode of which is connected to the input of an inverter 81. The input of the inverter 81 is also connected to the V+ supply through a parallel combination of a resistor 79 and a capacitor 80. The output of the continuity detector 70 is taken at the output of the inverter 81, designated by "②".

The outputs of the detectors 51, 62 and 70 are all connected to the logic circuit 90. More specifically, the output of the capacitor detector 51 is connected to the input of an inverter 91, the output of which is connected to one input of a NAND gate 92. The output of the transformer detector 62 is connected to the input of an inverter 93, which has its output connected to the other input of the NAND gate 92. The output of the NAND gate 92 is connected to the input of an inverter 94, the output of which is connected to one input of each of NAND gates 95 and 96, the outputs of which are, respectively, connected to the inputs of inverters 97 and 98. The output of the continuity detector 70 is connected directly to the other input of the NAND gate 95 and through an inverter 99 to the other input of the NAND gate 96. Outputs of the logic circuit 90 are taken at outputs of the inverters 94, 97 and 98, respectively designated by "④", "⑤" and "⑥", as will be explained in greater detail below.

The indicator circuit 100 includes a horn or buzzer 101 which is connected to the V+ supply through a resistor 102 and is also connected to the collector of a transistor 103, the emitter of which is connected to common. The base of the transistor 103 is connected through a resistor 104 to the output of an inverter 105, the input of which is connected through a resistor 107 to the output of the inverter 94 in the logic circuit 90. The input of the inverter 105 is also connected to the V+ supply through a capacitor 106 and also to the cathode of an anode 108 which is connected in parallel with the resistor 107. The V+ supply is also connected through a resistor 109 to the anodes of each of four LEDs 110, 111, 112 and 113, the cathodes of which are, respectively, connected to the collectors of transistors 114, 115, 116 and 117, which have their emitters connected to common. The bases of these transistors are, respectively, connected through resistors 118, 119, 120 and 121 to the outputs of AND gates 122, 123, 124 and 125. First inputs of the AND gates 122 and 125 are, respectively, connected to the outputs of the inverters 97 and 98 in the logic circuit 90, while first inputs of the AND gates 123 and 124 are, respectively, connected to the outputs of the capacitor detector 51 and the transformer detector 62. The second inputs of each of the AND gates 122–125 are connected to the output of a blinker circuit 130. More specifically, the blinker circuit 130 includes a NAND gate 131 which has its inputs connected to common respectively through capacitors 138 and 139, one of the inputs also being connected through a resistor 132 to the supply line 27 and to the anode of a diode 133 which is connected in parallel with the resistor 132. The other input of the NAND gate 131 is also connected to its output through a resistor 134 and through a series combination of a diode 135 and resistor 136 which are connected in parallel with the resistor 134. The output of NAND gate 131 is also connected to the input of an inverter 137, the output of which is connected to the AND gates 122–125. Preferably, the LEDs 111 and 112 are green and the LEDs 110 and 113 are red.

The purpose of the test apparatus 10 is to distinguish between inductive and capacitive devices and to indicate whether the connected device is "okay" or whether there is a short circuit or an open circuit between the connected terminals of the device. In use, the operator connects the test leads 12 and 13, respectively, to the terminals of the device 15 to be tested, typically a power transformer, capacitor or the like, as indicated in FIG. 2. The operator then closes the switch 24 of the power supply 20 by depressing the push button on the front panel of the housing 11. For as long as the switch 24 is held closed, the power supply 20 outputs a DC supply voltage V+, typically 9 VDC, to various points in the circuitry of the test apparatus, as illustrated in FIG. 3. The switch 24 is connected between common and the input of the inverter 25. Thus, when the switch 24 is closed, the input of the inverter 25 goes low and its output goes high on the supply line 27, this high being applied to the pulse generator 30.

More specifically, the high on the supply line 27 charges the capacitor 32 through resistor 31, causing the output of the inverter 33 to go low, which thus causes the gate of the MOSFET 40 to go low rendering it conductive and applying a current pulse through the diodes 42 and the fuse 45 to the test lead 12. The parallel inverters 37–39 are needed to provide sufficient current to drive the MOSFET 40. When the capacitor 32 is charged to a predetermined voltage, it discharges through the resistor 34 and the diode 35, causing the gate of the transistor 40 to go high, thereby turning it off. In this manner the capacitor 32 repeatedly charges and discharges, generating a pulsating output test signal 140 across the test leads 12, 13 for application to the tested device 15. The pulsating output signal 140 is illustrated in waveform A of FIG. 4 and is in the nature of a square wave alternating between zero volts and a peak voltage V1, the V+ supply being dropped to V1 by the diodes 42. The TVS 43 and capacitor 44 protect the circuitry of the test apparatus 10 from voltage transients. The pulses may have about a 1-microsecond duration at a frequency of about 100 Hz.

Referring to the capacitor detector 51, if the tested device 15 is capacitive, the test signal 140 will charge the capacitor, the number of pulses required for this purpose depending on the size of the capacitor. Once the capacitor is charged, the capacitor detector 51 functions by attempting to discharge the tested device immediately following the end of each succeeding pulse of the test signal 140. More particularly, the diode 52 and the resistor 53 cooperate with the base-emitter junction of the transistor 55 and the diode 56 to form a discharge path to the output of the inverter 57, which is low at this time. The discharge current turns the transistor 55 on. The input of the inverter 61 is normally held high by the capacitor 60, which is charged through the resistor 59, thereby holding the output of the inverter 61 at circuit location "①" low. Each time the transistor 55 is turned on, the capacitor 60 discharges through the resistor 58 and the transistor 55, eventually causing the input of the inverter 61 to go low and its output to go high. Thus, an "okay" capacitor connected across the test leads 12, 13 produces a high at the output of the capacitor detector 51.

Figure 4:
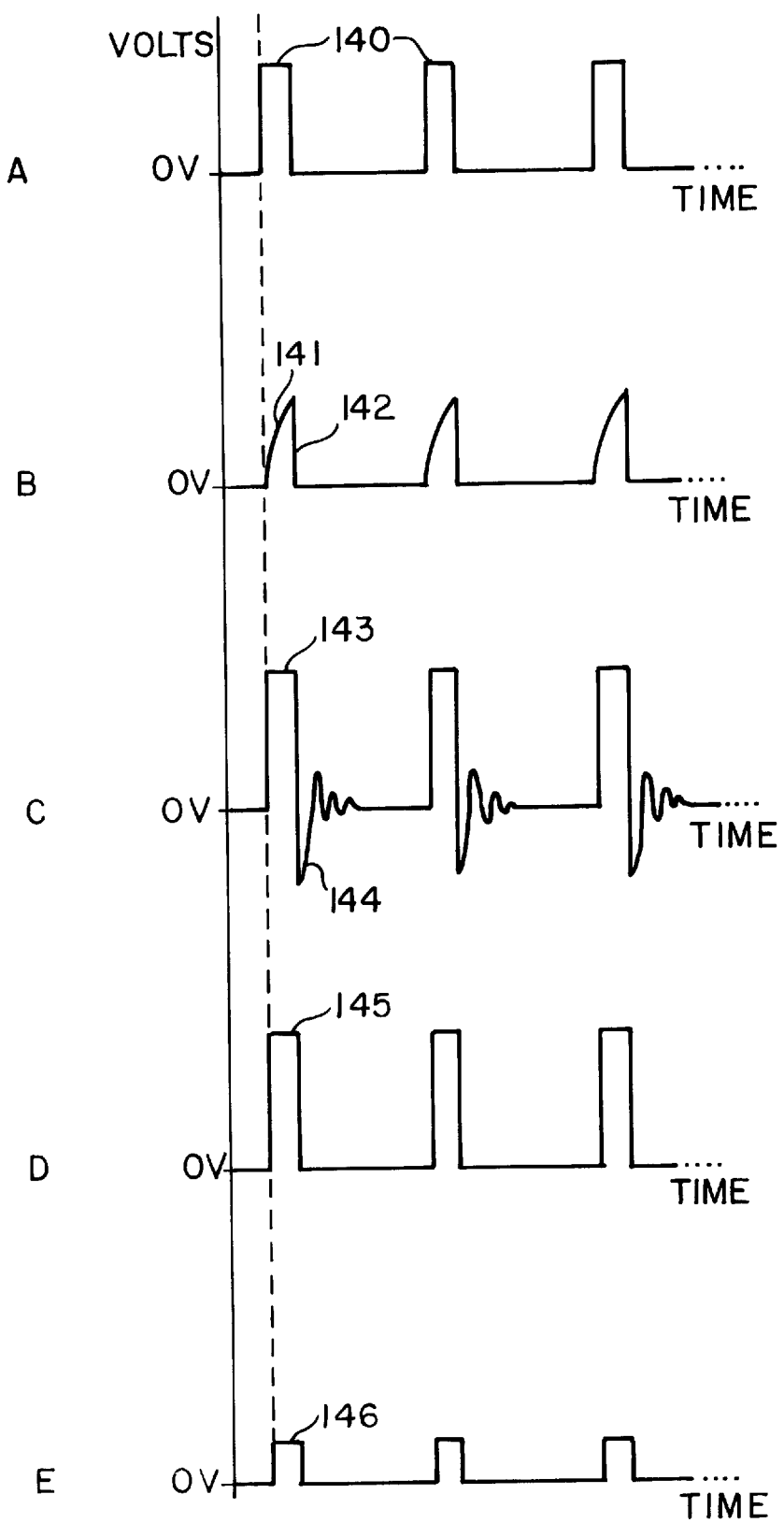
FIG. 4 is a diagram of the waveforms of signals including the test signal generated by the circuit of FIG. 3 and the responses of different tested devices thereto.

The operation of the capacitor detector 51 is illustrated in waveform B of FIG. 4, wherein 141 designates the charging voltage of the capacitive device connected across the test leads 12, 13, and 142 illustrates the discharge of the capacitor through the capacitor detector 51 at the termination of the test pulse 140.

The transformer detector 62 operates by detecting a voltage across the test leads 12, 13 which is opposite in polarity to the voltage of the test signal pulse 140, since this would be characteristic of an inductor, such as a transformer primary or secondary winding. More particularly, when a pulse signal, such as the test pulse 140, is applied to an inductor, it results in a voltage across the inductor like that illustrated in waveform C of FIG. 4. Thus, the voltage across the inductor initially tracks the voltage of the input pulse 140, but in response to the trailing edge of the input pulse 140 there is an inductive "kick-back" voltage 144 of an opposite polarity to the input pulse, followed by an oscillation or ringing. The transformer detector 62 looks for this kick-back voltage 144 of opposite polarity to the input pulse.

Thus, in this case, since the input pulse is positive, the circuit looks for a negative voltage. Such a negative voltage applied to the cathode of the diode 63 will cause the transistor 64 to turn on. The input of the inverter 69 is normally held high by the capacitor 68, which is charged through the resistor 67a. When the transistor 64 turns on in response to the presence of an inductor, the capacitor 68 discharges through the resistor 67 and the transistor 64, causing the input of the inverter 69 to go low and its output, at circuit location "③", to go high. Thus, an "okay" inductor across the test leads 12, 13 causes the output of the transformer detector 62 to go high.

The continuity detector 70 determines whether there is a high impedance (high resistance, high inductance or low capacitance), preferably greater than approximately 10 ohms, across the test leads 12, 13, which is interpreted as an open circuit, or a low impedance, which is interpreted as a short circuit. Basically, the continuity detector 70 measures the level of the voltage across the test leads 12, 13. More particularly, in the event that nothing is connected to the test leads 12, 13 (an open circuit) or if a connected circuit has a high impedance, each test pulse from the pulse generator 30 will be applied through the diode 71 and the voltage divider formed by the resistors 72 and 73 to the base of the transistor 74. This voltage 145 (FIG. 4D) at the base of transistor 74 will be above a certain threshold (e.g., about one-third the battery voltage), sufficient to turn on the transistor 74, which will try to discharge the capacitor 80 through the diode 78 and the resistor 77. After a sufficient number of test pulses, the capacitor 80 will be discharged sufficiently to bring the input of the inverter 81 low, causing its output, at circuit location "②", to go high.

If, on the other hand, there is a short circuit or low impedance across the test leads 12, 13, the voltage 146 (FIG. 4E) at the base of the transistor 74 will not be sufficient to turn it on. Thus, the input of the inverter will remain held high and its output will remain low, indicating a short circuit.

The outputs of the detectors 51, 62 and 70 are applied to the control logic 90, which controls the operation of the indicator circuit 100 in accordance with the pattern of outputs from the detection circuit 50. One input of each of the AND gates 125 of the indicator circuit 100 is connected to the output of the blinker circuit 130 which, in a known manner, produces a periodic output signal which alternates between high and low as long as the power supply switch 24 is held closed. This alternating high and low will be passed to one of the LEDs 110–113, whenever the corresponding one of the AND gates 125 is enabled by a high at its other input. Thus whenever an AND gate is enabled each high at the output of the blinker circuit 130 will cause the output of the AND gate to go high, turning on the associated one of the transistors 114–117 and lighting the corresponding one of the LEDs 110–113.

Table 1 is a chart illustrating the characteristics of the device connected to the test leads 12, 13, as indicated by the conditions of the indicator LEDs 110–113 and horn 101 in response to corresponding to patterns of detection circuit outputs.

|                          | Circuit Location |   |   |   |   |   | LED |      |
|--------------------------|---|---|---|---|---|---|-----|------|
| Connection at Test Leads | 1 | 2 | 3 | 4 | 5 | 6 | On  | Horn |
| Open Circuit or Resistance >10 ohms | 0 | 1 | 0 | 1 | 0 | 1 | 110 | No |
| Short Circuit            | 0 | 0 | 0 | 1 | 1 | 0 | 113 | No  |
| Capacitor                | 1 | X | 0 | 0 | 0 |   | 111 | Yes |
| Transformer              | 0 | X | 1 | 0 | 0 | 0 | 112 | Yes |

Note:
1 = high
0 = low
X = high or low depending on size of connected device

Referring to Table 1, when the output of the capacitor detector 51 at circuit location "①" is high, indicating a good capacitor connected across the test leads 12, 13, the green LED 111 will blink on and off, whereas a high at the output of the transformer detector 62 at circuit location "③", indicating a good inductor connected across the test leads 12, 13, will cause the green LED 112 to blink on and off. An open circuit or high resistive impedance, indicated by a high at the output of the continuity detector 70 at circuit location "②" and lows at circuit locations "①" and "③", will result in highs at circuit locations "④" and "⑥", causing the red LED 110 to blink on and off. On the other hand, when the output of the continuity detector 70 at circuit location "②" is low, while circuit locations "①" and "③" are low, this results in highs at circuit locations "④" and "⑤", causing the red LED 110 to blink on and off.

Whenever either or both of the outputs from the capacitor detector 51 and the transformer detector 62 is high, indicating a good transformer or capacitor connected thereto, the output of the inverter 94 at circuit location "④" will be caused to go low. This will cause the output of the inverter 105 to go high after a predetermined ON-delay determined by the time delay circuit of elements 106–108. This will turn on the transistor 103, sounding the horn 101. The ON-delay prevents beeping of the horn at turn-on while the circuitry stabilizes. Thus, whenever a good capacitor or detector is connected across the test leads 12, 13, the horn 101 will sound in addition to lighting of the corresponding one of the LEDs 111 or 112. The horn 101 will sound and the LEDs will continue to flash for as long the push-button switch 24 of the power supply 20 is held closed or until the tested device 15 is disconnected.

From the foregoing, it can be seen that there has been provided an improved test apparatus which unambiguously distinguishes between capacitive and inductive tested devices, as well as indicating whether the device is okay or has a short circuit or an open circuit.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. Test apparatus for identifying characteristics of a tested device comprising:

a signal generator having test leads across which the tested device may be connected for applying a test signal to the tested device, and a detection circuit connected across said test leads for sensing the response of the tested device to the test signal, said detection circuit including a capacitor detector providing a first indication if the tested device is capacitive, an inductor detector providing a second indication if the tested device is inductive, and a circuit continuity detector providing a further indication if the tested device is open-circuited or short-circuited.

2. The test apparatus of claim 1, wherein said capacitor detector includes a discharge path and a switch operable in response to discharge of the capacitor through the discharge path.

3. The test apparatus of claim 2, wherein said switch includes a transistor.

4. The test apparatus of claim 2, wherein said capacitor detector includes active circuitry for generating an output signal in response to closing of said switch.

5. The test apparatus of claim 4, and further comprising an indicator circuit coupled to said capacitor detector and providing an indication in response to said output signal.

6. The test apparatus of claim 5, wherein said indicator circuit includes audible and visible annunciators.

7. The test apparatus of claim 2, wherein said signal generator includes a pulse generator for applying a periodic pulse signal to the tested device.

8. Test apparatus for identifying characteristics of a tested device comprising:

a signal generator having test leads across which the tested device may be connected for applying a test signal to the tested device, and a detection circuit connected across said test leads for sensing the response of the tested device to the test signal, said detection circuit including a capacitor detector providing a first output signal if the response of the tested device to the test signal indicates that the tested device is capacitive, and an inductor detector providing a second output signal if the response of the tested device to the test signal indicates that the tested device is inductive.

9. The test apparatus of claim 8, wherein said capacitor detector includes a discharge path and a switch operable in response to discharge of the capacitor through the discharge path.

10. The test apparatus of claim 8, wherein said inductor detector includes a circuit responsive to a voltage of a polarity opposite to that of the test signal for producing said second output signal.

11. The test apparatus of claim 10, wherein said inductor detector includes a transistor switch which is rendered conductive in response to a voltage having a polarity opposite to that of the test signal.

12. The test apparatus of claim 8, and further comprising an indicator circuit coupled to said capacitor detector and to said inductor detector and responsive to said first and second output signals for respectively producing first and second indications.

13. The test apparatus of claim 12, wherein said indicator circuit includes first and second LEDs respectively responsive to said first and second output signals.

14. The test apparatus of claim 13, wherein said indicator circuit further includes an audible annunciator responsive to either of said first and second output signals.

15. The test apparatus of claim 13, wherein said transistor has a base connected in said discharge path for rendering the transistor conductive in the presence of a discharge current in the discharge path.

16. The test apparatus of claim 1, wherein said continuity detector includes circuitry for producing a third indication in response to a substantially open circuit connected across said test leads and a fourth indication in response to connection of a substantially short circuit across said test leads.

17. The test apparatus of claim 1, wherein said continuity detector includes circuitry for measuring the level of the voltage across connected terminals of the tested device.

18. The test apparatus of claim 1, and further comprising logic circuitry coupled to said capacitor detector and to said inductor detector and to said continuity detector, and an indicator circuit coupled to said logic circuitry for producing a plurality of indications respectively corresponding to different characteristics of the tested device.

19. The test apparatus of claim 18, wherein said indicator circuit includes audible and visible annunciators.

20. The test apparatus of claim 19, wherein said indicator circuit further includes means for intermittently operating said visible annunciators.

21. The test apparatus of claim 18, wherein said continuity detector has an output and produces a first signal condition at said output if the tested device is open-circuited and a second signal condition at said output if the tested device is short-circuited.

22. The test apparatus of claim 21, wherein said logic circuit responds to an absence of signal from any of the detectors to produce an indication that the tested device is short-circuited.

23. The test apparatus of claim 7, wherein said pulse signal is periodic.

* * * * *

UNITED STATES PATENT AND TRADEMARK OFFICE
CERTIFICATE OF CORRECTION

PATENT NO : 6,130,530

DATED : Oct 10, 2000

INVENTOR(S) : William J. McNulty

It is certified that error(s) appear in the above-identified patent and that said Letters Patent are hereby corrected as shown below:

Column 9, line 1, "claim 13" should be --claim 3--.

Signed and Sealed this

Eighth Day of May, 2001

NICHOLAS P. GODICI

*Attest:*

*Attesting Officer*     Acting Director of the United States Patent and Trademark Office